(12) United States Patent
Suzuki et al.

(10) Patent No.: US 12,221,690 B2
(45) Date of Patent: Feb. 11, 2025

(54) SANITARY EQUIPMENT PART

(71) Applicant: TOTO LTD., Kitakyushu (JP)

(72) Inventors: Yuya Suzuki, Kitakyushu (JP); Saori Ukigai, Kitakyushu (JP); Hironori Hatono, Kitakyushu (JP); Atsushi Teramoto, Kitakyushu (JP); Yuichi Takamatsu, Kitakyushu (JP); Hana Ishii, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 17/280,705

(22) PCT Filed: Mar. 1, 2021

(86) PCT No.: PCT/JP2021/007683
§ 371 (c)(1),
(2) Date: Mar. 26, 2021

(87) PCT Pub. No.: WO2021/199834
PCT Pub. Date: Oct. 7, 2021

(65) Prior Publication Data
US 2023/0012781 A1 Jan. 19, 2023

(30) Foreign Application Priority Data

Mar. 31, 2020 (JP) .................. 2020-064497

(51) Int. Cl.
*C23C 14/00* (2006.01)
*B32B 15/04* (2006.01)
(Continued)

(52) U.S. Cl.
CPC .......... *C23C 14/547* (2013.01); *B32B 15/04* (2013.01); *B32B 15/08* (2013.01); *B32B 18/00* (2013.01);
(Continued)

(58) Field of Classification Search
CPC .......... B05D 1/283; B05D 5/08; B05D 5/083; B05D 2202/00; B05D 2350/63;
(Continued)

(56) References Cited

U.S. PATENT DOCUMENTS

| | | | |
|---|---|---|---|
| 2009/0225519 A1* | 9/2009 | Mischel, Jr. ............ | G09F 19/14 348/731 |
| 2014/0130687 A1 | 5/2014 | Shibusawa et al. | |
| 2014/0356764 A1* | 12/2014 | Iseki ....................... | C23C 16/26 429/518 |

FOREIGN PATENT DOCUMENTS

| | | |
|---|---|---|
| JP | H06-263484 A | 9/1994 |
| JP | H08-232081 A | 9/1996 |

(Continued)

OTHER PUBLICATIONS

O. Hammadi, Fundamentals of Plasma Sputtering, available at www.researchgate.net/publication/283490139_Fundamentals_of_Plamsa_Sputtering, downloaded on Mar. 22, 2024, Nov. 2015. (Year: 2015).*

(Continued)

*Primary Examiner* — Michael E. La Villa
(74) *Attorney, Agent, or Firm* — Carrier, Shende & Associates P.C.; Joseph P. Carrier; Jeffrey T. Gedeon

(57) ABSTRACT

A part includes a base material, a colored layer, an intermediate layer, and a water-repellent-surface layer. The colored layer contains 35 at % to 99 at % of C, 0 at % to less than 40 at % of Cr, 0 at % to less than 15 at % of N, and more than 0 at % to less than 15 at % of O. The intermediate layer contains at least one metal atom selected from Cr, Zr, and Si; and an oxygen atom. The intermediate layer exhibits a sputtering time of 0.5 minutes or more to 9 minutes or less.

17 Claims, 1 Drawing Sheet

(51) Int. Cl.
| | |
|---|---|
| B32B 15/08 | (2006.01) |
| B32B 18/00 | (2006.01) |
| C09K 3/18 | (2006.01) |
| C23C 14/02 | (2006.01) |
| C23C 14/06 | (2006.01) |
| C23C 14/08 | (2006.01) |
| C23C 14/10 | (2006.01) |
| C23C 14/34 | (2006.01) |
| C23C 14/54 | (2006.01) |
| C23C 28/00 | (2006.01) |
| C23C 30/00 | (2006.01) |
| B05D 1/28 | (2006.01) |
| B05D 5/08 | (2006.01) |

(52) U.S. Cl.
CPC ............ *C09K 3/18* (2013.01); *C23C 14/0015* (2013.01); *C23C 14/0036* (2013.01); *C23C 14/0057* (2013.01); *C23C 14/025* (2013.01); *C23C 14/0635* (2013.01); *C23C 14/0641* (2013.01); *C23C 14/0664* (2013.01); *C23C 14/086* (2013.01); *C23C 14/10* (2013.01); *C23C 14/34* (2013.01); *C23C 28/00* (2013.01); *C23C 28/34* (2013.01); *C23C 28/341* (2013.01); *C23C 28/345* (2013.01); *C23C 28/3455* (2013.01); *C23C 28/36* (2013.01); *C23C 30/00* (2013.01); *C23C 30/005* (2013.01); *B05D 1/283* (2013.01); *B05D 5/08* (2013.01); *B05D 5/083* (2013.01); *B05D 2202/00* (2013.01); *B05D 2350/63* (2013.01); *Y10T 428/12438* (2015.01); *Y10T 428/12458* (2015.01); *Y10T 428/12472* (2015.01); *Y10T 428/12556* (2015.01); *Y10T 428/12569* (2015.01); *Y10T 428/12611* (2015.01); *Y10T 428/12618* (2015.01); *Y10T 428/12625* (2015.01); *Y10T 428/1266* (2015.01); *Y10T 428/12667* (2015.01); *Y10T 428/12674* (2015.01); *Y10T 428/12736* (2015.01); *Y10T 428/12806* (2015.01); *Y10T 428/12847* (2015.01); *Y10T 428/12903* (2015.01); *Y10T 428/12951* (2015.01); *Y10T 428/24942* (2015.01); *Y10T 428/2495* (2015.01); *Y10T 428/24959* (2015.01); *Y10T 428/24967* (2015.01); *Y10T 428/26* (2015.01); *Y10T 428/263* (2015.01); *Y10T 428/264* (2015.01); *Y10T 428/265* (2015.01)

(58) Field of Classification Search
CPC ..... C09K 3/18; C23C 14/547; C23C 14/0015; C23C 14/0036; C23C 14/0057; C23C 14/025; C23C 14/0635; C23C 14/0641; C23C 14/0664; C23C 14/086; C23C 14/10; C23C 14/34; C23C 28/00; C23C 28/34; C23C 28/341; C23C 28/345; C23C 28/3455; C23C 28/36; C23C 30/00; C23C 30/005; B32B 15/04; B32B 15/08; B32B 18/00; Y10T 428/12847; Y10T 428/12806; Y10T 428/12674; Y10T 428/1266; Y10T 428/12667; Y10T 428/12611; Y10T 428/12618; Y10T 428/12556; Y10T 428/12569; Y10T 428/263; Y10T 428/264; Y10T 428/265; Y10T 428/26; Y10T 428/12458; Y10T 428/12438; Y10T 428/12472; Y10T 428/12625; Y10T 428/12903; Y10T 428/12951; Y10T 428/12736; Y10T 428/2495; Y10T 428/24942; Y10T 428/24959; Y10T 428/24967
See application file for complete search history.

(56) References Cited

FOREIGN PATENT DOCUMENTS

| | | |
|---|---|---|
| JP | 2003-291251 A | 10/2003 |
| JP | 2004-217950 A | 8/2004 |
| JP | 2017-019279 A | 1/2017 |
| JP | 2017-025382 A | 2/2017 |

OTHER PUBLICATIONS

Extended European search report, mailed on Dec. 5, 2022, issued in the corresponding EP Patent Application No. 21781378.1.
PCT/ISA/210 from International Application PCT/JP2021/007683 with the English translation thereof.
PCT/IB/373 and PCT/ISA/237 from International Application PCT/JP2021/007683.

* cited by examiner

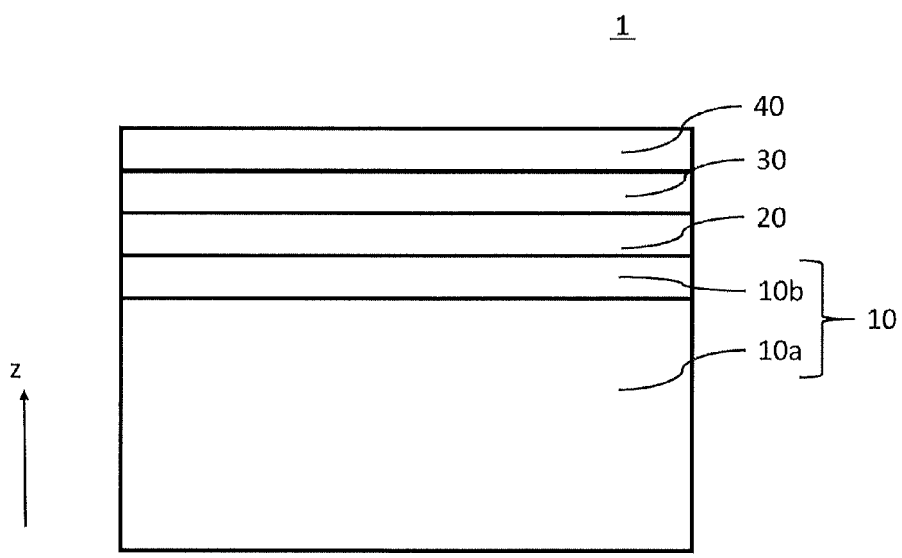

SANITARY EQUIPMENT PART

TECHNICAL FIELD

The present invention relates to a part having a deep-colored appearance, and particularly to a part not only having a deep-colored, preferably a black-colored appearance but also having good adhesion exhibited by a water-repellent layer provided on a surface thereof.

BACKGROUND ART

In order to enhance the design of a sanitary equipment part such as a faucet fitting, an appearance with a desired color tone has been created by providing a colored layer on a base material. In particular, in order to realize a black-colored appearance, a technique of plating a base material with a particular metal element or a technique of providing a colored layer mainly containing carbon (C) on a base material has been known.

For example, JP H08-232081 A (PTL 1) discloses that a faucet fitting with a dark color tone is formed by plating a surface of the faucet fitting with a solution of trivalent chromium, not the general hexavalent chromium. Furthermore, JP 2017-25382 A (PTL 2) discloses that a tin-nickel alloy plated film with an excellent black color tone is formed by plating in a tin-nickel alloy plating bath containing a particular sulfur-containing compound.

A faucet including therein a colored layer mainly containing C (product name: FAUCET Z-series, G-series, L-series, TOTO LTD.) (https://www.toto.com/en/gb_faucet/, Non-PTL 1), and a faucet with a black coating (product name: New Vega color faucet, sanwacompany ltd.) (https://www.sanwacompany.cc.jp/shop/series/S0884/, Non-PTL 2) have been released.

In a sanitary equipment part with a colored layer, it is preferable that the visual color of the three-dimensional object from any angle is not changed, Color unevenness of the three-dimensional object, instability in color of the colored layer, a damage on the colored layer, or the like may impair the appearance of the part and may degrade the product value of the part. For example, the present inventors have confirmed that, in a case of coloring a three-dimensional object with a colored layer mainly containing C, there is a problem in color stability and strength of the colored layer. Furthermore, if the colored layer is thin, an interference color is generated, and it is often difficult to achieve the intended black color.

On the other hand, as a technique for improving a surface of a part in order to prevent the adhesion of stains such as scales on the surface of the part or to increase stain removability, a technique of covering the surface of the part with a protective layer has been known. In a known antifouling technique, a water-repellent layer capable of chemically bonding directly to a base material is used as said protective layer. For example, JP 2004-217950 A (PTL 3) discloses that providing a thin water-repellent layer on a faucet fitting can obtain scale removability. Since the water-repellent layer is a thin layer that is not visually recognizable, it is unlikely that the provision of the water-repellent layer impairs the appearance of the part, and the water-repellence can be imparted to the part.

CITATION LIST

Patent Literatures

[PTL 1] JP H08-232081 A
[PTL 2] JP 2017-25382 A
[PTL 3] JP 2004-217950 A

Non-Patent Literatures

[NPL 1] https://www.toto.com/en/gb_faucet/
[NPL 2] https://ww.sanwacompany.cc.jp/shop/series/S0884/

SUMMARY OF INVENTION

Technical Problem

The present inventors have found that a colored layer with a particular composition is excellent in both stability and strength (particularly, hardness near surface). Furthermore, the present inventors have created an intermediate layer that, when a water-repellent layer is provided on the colored layer, not only affects less on the color development of the colored layer but also imparts stability and durability to the water-repellent layer. The present invention is based on such findings.

Therefore, an object of the present invention is to provide a part including a colored layer, in particular a black-colored layer, with improved stability of color and strength (particularly, hardness near surface), and further including on the colored layer a water-repellent layer with stability and durability.

Solution to Problem

A part according to the present invention is a part including at least a base material, a colored layer on the base material, an intermediate layer on the colored layer, and a surface layer on the intermediate layer, wherein
  the colored layer contains:
    more than 35 at % to 99 at % or less of C,
    0 at % or more to less than 40 at % of Cr,
    0 at % or more to less than 15 at % of N, and
    more than 0 at % to less than 15 at % of O,
    provided that the total of C, Cr, N, and O is 100 at %,
  in a profile obtained by an XPS depth direction analysis,
    in a depth region after 8 minutes from when an atomic ratio of Cr, Zr, or Si exceeds that of C; and
  the intermediate layer contains at least one metal atom selected from Cr, Zr, and Si; and an oxygen atom,
  the metal element in an oxidized state is detected with XPS in the intermediate layer, and
  the intermediate layer exhibits a sputtering time of 0.5 minutes or more to 9 minutes or less, the sputtering time being a time taken from when the metal element is detected to when the amount of the detected oxygen atoms exceeds the amount of the detected oxygen atoms (O) contained in the colored layer, with an XPS depth direction analysis; and
  the surface layer
  is water-repellent, and
  includes a hydrophobic group, and
  exhibits, in a profile obtained by the XPS depth direction analysis, a sputtering time of more than 0.5 minutes to 5 minutes or less, the sputtering time being a time taken from when the sputtering starts to when the metal atom contained in the intermediate layer starts to be detected.

BRIEF DESCRIPTION OF DRAWINGS

FIG. 1 is a schematic diagram illustrating one example of a part according to the present invention.

DESCRIPTION OF THE INVENTION

Part According to the Present Invention and Basic Structure Thereof

1. Part

A part to which the present invention is suitably applied is a part, a surface of which is colored; and which is used for a long time, and, during the long time, is regularly subjected to cleaning in a manner that the surface of which is rubbed. One example of the part is "sanitary equipment part", and specifically, a water supply and drainage equipment of a building or indoor equipment that is used in an environment exposed to water (for example, water for domestic use (or water for industrial use)). In the present invention, the environment exposed to water may be any place where water is used, such as houses and public facilities like parks, commercial facilities, and offices. Such places specifically include bathrooms, toilet spaces, dressing rooms, washrooms, kitchens, and the like.

In the present invention, specific examples of the sanitary equipment part include equipments used in bathrooms, toilet spaces, dressing rooms, washrooms, kitchens, and the like; and products including plated or PVD-coated equipments. Examples include faucets, drain fittings, water blocking fittings, washbasins, doors, shower heads, shower bars, shower hooks, shower hoses, handrails, towel hangers, kitchen counters, kitchen sinks, drainage baskets, kitchen hoods, ventilation fans, drains, toilet bowls, urinals, electronic bidets, lids for electronic bidets, nozzles for electronic bidets, operation panels, operation switches, operation levers, handles, and doorknobs. In particular, the present invention is suitably used in the faucet.

The base material used for the part according to the present invention means the base material of the sanitary equipment part. The part according to the present invention includes the colored layer on the surface thereof. As illustrated in FIG. 1, the part 1 includes a base material 10 and a colored layer 20 on the base material 10. The part 1 according to the present invention further includes a surface layer 40 on the colored layer 20, which is described below. The part 1 according to the present invention further includes an intermediate layer 30 between the colored layer 20 and the surface layer 40.

2. Base Material

In the present invention, the material of the base material 10 is not particularly limited, and, for example, materials generally used as base materials of the sanitary equipment part can be used.

Support Member 10a of Base Material 10

In the present invention, the base material 10 includes a support member 10a. That is to say, the base material 10 consists of the support member 10a, includes the support member 10a and another element, or includes a region 10b, which is described below, on a surface of the support member 10a, the surface being present on the side of the surface layer 40. As a material of the support member 10a, a metal, resin, ceramic, pottery, or glass can be used.

Region 10b of Base Material 10

The base material 10 may include the region 10b, as illustrated in FIG. 1. The region 10b is formed on a surface of the support member 10a, the surface being present on the side of the surface layer. The region 10b is preferably a layer containing a metal, or a layer consisting of an inorganic compound mainly containing carbon. The region 10b can be formed by metal plating or physical vapor deposition (PVD), for example. The region 10b may consist of only metal elements, or may include metal nitrides (such as TiN and TiAlN), metal carbides (such as CrC), and metal carbonitrides (such as TiCN, CrCN, ZrCN, and ZrGaCN). The region 10b may be formed directly on the support member 10a, or may include a different layer between the region 10b and the support member 10a. For example, the base material 10 provided therein the region 10b includes a metal-plated product in which the region 10b is provided by a metal plating treatment on the support member 10a formed of brass or a resin. On the other hand, for example, the base material 10 not provided therein the region 10b includes a metal molded product such as stainless steel (SUS). The shape of the base material 10 is not particularly limited, and may be a simple flat plate shape or a three-dimensional shape. Since the present invention provides a part whose color changes less depending on the viewing direction or angle, the present invention is suitably applied to the base material 10 with the three-dimensional shape.

3. Colored Layer

Structure of Colored Layer

In the present invention, the colored layer 20 is a layer containing a carbon atom (C), a chromium atom (Cr), a nitrogen atom (N), and an oxygen atom (O), and specifically, the color layer 20 contains:

more than 35 at % to 99 at % or less of C,
0 at % or more to less than 40 at % of Cr,
0 at % or more to less than 15 at % of N, and
more than 0 at % to less than 15 at % of O, or preferably, more than 50 at % to 99 at % or less of C,
0 at % or more to less than 35 at % of Cr,
0 at % or more to less than 15 at % of N, and
more than 1 at % to less than 15 at % of O
provided that the total of C, Cr, N, and O is 100 at %, in a profile obtained by an XPS depth direction analysis,
in a depth region after 8 minutes from when an atomic ratio of Cr, Zr, or Si exceeds that of C.

The color of the colored layer 20 is basically black, and the colored layer can realize, in particular, a black color called "jet black", as its color tone (hue). The sanitary equipment part with such a color tone, for example, is highly added-value, and in a case of a faucet in particular, the faucet can exhibit a sense of luxuriousness, and the product value of the faucet can be increased largely. In addition, the colored layer with the aforementioned composition is advantageous in that the color does not change depending on the viewing direction or angle, and that the black appearance can be observed even in the three-dimensional part whose shape is not monotonic. The colored layer is also excellent in the strength (particularly, hardness near surface) in addition to the color stability. Many of the sanitary equipment parts are used for a long time, and, during the long time, are regularly subjected to cleaning in a manner that the surfaces of the parts are rubbed. The colored layer 20 according to the present invention is excellent in durability over such cleaning.

By the combination of the compositions as described above, the colored layer 20 in the present invention obtains the advantageous effects not only in the black color development, and the color stability, but also in the strength (particularly, hardness near surface). When the colored layer is applied to the part, the amount of Cr is often important for its further optimization. It is preferable to optimize the colored layer in consideration of the amount of Cr.

In a preferred embodiment of the present invention, the colored layer 20 preferably consists of Cr, C, N, and O. Herein, the expression "consists of" means that the total concentration of the above atoms obtained by the composition analysis method of the colored layer 20, which is described below, is 90 at % or more to 100 at % or less. In other words, the colored layer 20 may contain one or two or more elements other than C, Cr, N, and O within the range where the total concentration thereof is less than 10 at %. Even if the colored layer 20 contains the other elements in the above range, it is considered that the desired black color in the present invention is maintained because the colored layer 20 consists of Cr, C, N, and O.

Identification of Colored Layer

In the present invention, the composition of the colored layer 20, specifically, each ratio (%) of Cr, C, N, and O contained in the colored layer 20 is obtained as the ratio of each atom provided that the total of C, Cr, N, and O at a measurement point is 100 at %. The measurement point is set, in a profile obtained by the XPS depth direction analysis, as a depth region after 8 minutes from when an atomic ratio of Cr, Zr, or Si exceeds the atomic ratio of C. Here, the "profile obtained by the XPS depth direction analysis" means the profile obtained by the XPS measurement using "sputtering conditions 1" described below.

In all the XPS measurements described herein, the following "XPS measurement conditions" are used.

XPS Measurement Conditions

X-ray condition: monochromatic AlKα ray (output 25 W)
Photoelectron take-off angle: 45°
Analysis area: 100 μmφ
Element to be analyzed (energy range): Zr3d (177-187 eV), C1s (281-296 eV), N1s (394-406 eV), O1s (524-540 eV), Cr2p3 (572-582 eV), Si2p (98-108 eV)

In the present invention, the element composition in the depth direction of each layer and the like are identified by performing the depth direction analysis with a combination of the XPS measurement and the sputtering using Ar ions. In the present invention, the depth direction analysis with a combination of the XPS measurement and the sputtering using Ar ions is referred to as "XPS depth direction analysis". In the XPS depth direction analysis, the sputtering using Ar ions and the XPS measurement are alternately repeated. As the conditions in the XPS measurement, "XPS measurement conditions" described above can be used. As the conditions at the sputtering (hereinafter also referred to as "sputtering conditions"), the following conditions can be used. The XPS measurement is performed for the respective "sputtering cycle"s in the respective sputtering conditions. By the XPS depth direction analysis, the spectrum information is obtained. From this spectrum information, the depth profile (profile) of the element composition is acquired. From this profile, the element composition in the depth direction can be identified.

Sputtering Conditions 1
(Sputtering conditions 1 at the XPS depth direction analysis, hereinafter referred to as "sputtering conditions 1")
Inert gas species: Ar
Sputtering voltage: 4 KV
Sputtering range: 2 mm*2 mm
Sputtering cycle: 10 seconds Sputtering Conditions 2
(Sputtering Conditions 2 at the XPS Depth Direction Analysis, Hereinafter Referred to as "Sputtering Conditions 2")
Inert gas species: Ar
Sputtering voltage: 500 V
Sputtering range: 2 mm*2 mm
Sputtering cycle: 1 minute It is noted that the sputtering voltage is the voltage that is applied to an Ar ion gun and the sputtering range is the range on the surface that is cut by sputtering. The sputtering cycle is the time for which Ar gas is emitted continuously for each measurement in the depth direction, and the total of the sputtering cycles is a sputtering time, Thickness of Colored Layer In the present invention, the thickness of the colored layer 20 can be obtained by the following method. First, an arbitrary point on a design surface of the part 1 including the colored layer 20 (the design surface referring to a visible portion when the part is placed as a product, excluding an invisible portion) is cut in a direction perpendicular to the colored layer 20 (in the Z direction shown in FIG. 1). The resulting surface is polished using a rough polisher and a fine polisher in this order to obtain a smooth cross section. If the polishing trace interrupts the observation, the resulting surface is milled using an ion milling device or the like to obtain a smooth cross section. This cross section is observed by scanning electron microscope/energy dispersive X-ray spectroscopy (SEM/EDX), the colored layer 20 and the base material 10 are identified. In case the colored layer has a thickness of 0.5 μm to 4.0 μm, the observation is performed at the observation magnification of 10000 to 30000, and a SEM image is acquired so that the interface between the colored layer 20 and the base material 10 exists within the SEM image, and the interface is horizontal. If the magnification is too low and the thickness of the colored layer 20 is small, then the colored layer 20 cannot be observed, and thus the thickness thereof cannot be specified; while if magnification is too high and the thickness of the colored layer 20 is large, then the interface between the base material and the colored layer and the interface of the colored layer on the opposite side to the base material cannot be captured in the observation region, and thus the thickness of the colored layer cannot be specified. By performing the mapping analysis with EDX on the SEM image, the elemental distribution in the colored layer 20 and in the base material 10 can be visually confirmed. For example, in case the base material is the one other than a resin base material, mapping with C which is the constituent element of the colored layer can clearly define the boundary surface. In the case of the resin base material, the boundary surface can be confirmed by mapping with element other than C, namely, O or N, or by the structural observation. A boundary surface where the different element distribution is confirmed is identified as the boundary surface between the colored layer 20 and the base material 10. A line that vertically halves the acquired SEM image is set as a center, and in parallel to the line, two lines are drawn at equal intervals in each of left and right sides of the center line. Points where each of the total of five vertical lines drawn in the SEM image intersects with the boundary surface between the colored layer and the base material and with a surface of the colored layer on the opposite side to the base material are obtained. The length of each of the five vertical line segments in the SEM image that is fractionated by the two intersections is measured, and the average value of the lengths of the five line segments is set as the thickness of the colored layer 20.

4. Intermediate Layer

Structure of Intermediate Layer

In the present invention, the part 1 includes the intermediate layer 30 between the colored layer 20 and the surface layer 40. A preferable example of the intermediate layer 30 is a layer containing a metal atom and an oxygen atom. In the intermediate layer 30, the metal atom is bonded to the oxygen atom. In other words, the intermediate layer 30 contains the metal element in an oxidized state. In the present invention, the metal element is preferably at least one selected from the group consisting of Cr, Zr, and Si.

In the intermediate layer 30, the sputtering time taken from when the metal element is detected to when the amount of the detected oxygen elements contained in the intermediate layer 30 exceeds the amount of the detected oxygen elements contained in the colored layer 20, with the XPS depth direction analysis, is 0.5 minutes or more and 9 minutes or less. If the metal element is Cr or Zr, the sputtering time is more than 0.5 minutes to 2 minutes or less, and if the metal element is Si, the sputtering time is 0.5 minutes or more to 7 minutes or less, preferably more than 0.5 minutes to 4 minutes or less, and more preferably more than 0.5 minutes to 2 minutes or less. It is preferable, from a view point of maintaining the appearance, that the intermediate layer 30 Has such a thickness that the sputtering time is within the above range. Here, the "XPS depth direction analysis" means a XPS depth direction analysis using the "XPS measurement conditions" and the "sputtering conditions 1."

In case it is difficult for the colored layer 20 mainly containing C to bond to the water-repellent surface layer 40, providing the intermediate layer 30 containing the metal atom between the colored layer 20 and the surface layer 40 allows for the formation of a chemical bond between the functional group X contained in the surface layer 40, which has a coordination to the metal atom contained in the intermediate layer 30, and the metal atom contained in the intermediate layer 30. The surface layer 40 is bonded to the intermediate layer 30 through the functional group X. The intermediate layer 30 containing the metal atom can form a stable passivation layer on the surface of the colored layer 20. Here, the stable passivation layer means a layer containing metal oxide and having durability such as sufficient water resistance and abrasion resistance.

In the present invention, the intermediate layer 30 first allows the surface layer 40 with the thickness enough to sufficiently exhibit its water-repelling function to be provided on the colored layer 20, without basically affecting the color development of the colored layer 20. The intermediate layer 30 can further have an advantageous effect that the unevenness in thickness of the portions of the surface layer 40 depending on the corresponding surface shapes of the product does not occur.

The optical path length differs, and thus, the thickness at which the interference occurs differs between a case where Cr or Zr oxide with a refractive index of 2.4-5 is used and a case where Si oxide with a refractive index of 1.4-5 is used. Specifically, the thickness that starts to affect the color development of the colored layer 20 becomes larger when Si oxide is used compared to when Cr or Zr oxide is used. On the other hand, the sputtering efficiency for Si oxide is higher than that for Zr or Cr oxide, and therefore, Si oxide is sputtered faster if the thickness of the above two types of layers is the same as each other. That is why the sputtering time for the intermediate layer containing Si is about the same as the sputtering time for the intermediate layer containing Cr or Zr.

The part including the surface with the three-dimensional shape easily has the thickness unevenness. A stack structure in which the surface layer 40 thinner than the intermediate layer is formed while the thickness unevenness of the intermediate layer 30 is suppressed can provide the part that does not impair the texture (color tone) of the colored layer 20 having deep color.

Identification of Intermediate Layer
<Determination of Constituent Elements of Intermediate Layer>

The existence of the metal atom in the intermediate layer 30 and the bond between the metal atom and the oxygen atom can be confirmed in the XPS measurement using "sputtering conditions 1". Depending on the presence or absence of the peaks of the following elements, the existence of the elements can be confirmed: zirconium, Zr3d (177-187 eV); oxygen, O1s (524-540 eV); chromium, Cr2p3 (572-582 eV); and Si (98-108 eV).

<Determination of Oxidized State of Metal Atom Contained in Intermediate Layer>

The bonding state between each metal atom and the oxygen atom contained in the intermediate layer 30, that is, the oxidized state of each metal atom can be confirmed by the peak shift depending on the difference in bonding energy between each metal atom and the oxygen atom. Specifically, O1 s derived from metal oxide has a peak at 530 to 532 eV, and the bond between each metal atom and the oxygen atom can be confirmed depending on whether the peak exists at 576-580 eV for Cr2p3, 182-183 eV for Zr3d, and 103-104 eV for Si2p.

<Determination of Thickness of Intermediate Layer>

In the present invention, the thickness of the intermediate layer 30 is determined, as its index, by adopting the sputtering time taken from when the metal element is detected to when the amount of the detected oxygen elements (O) contained in the intermediate layer 30 exceeds the amount of the detected oxygen elements (O) contained in the colored layer 20, wherein the sputtering time is obtained by the XPS depth direction analysis, specifically, the XPS depth direction analysis using the "XPS measurement conditions" and "sputtering conditions 1" described above.

5. Surface Layer

The surface layer 40 in the present invention is a water-repellent layer containing organic molecules, and is transparent and thin enough not to damage the color tone of the colored layer 20 or the base material 10 below the surface layer 40. Since the surface layer 40 is the water-repellent layer, the adhesion of scales can be suppressed and the scales once adhered can be easily removed in a sanitary equipment part contacting with tap water including silicon and calcium (that causes the formation of scales).

In the present invention, the surface layer 40 may be a high molecular layer, a low molecular layer, or a mono (molecular) layer.

In the present invention, the high molecular layer is a layer containing a high molecule compound. Furthermore, the low molecular layer is a layer containing a low molecule compound. The high molecule compound and the low molecule compound include a hydrophobic group R. Having the hydrophobic group R confers water-repellency on the surface layer 40.

Examples of Hydrophobic Group R

In the present invention, the hydrophobic group A includes an alkyl chain. The hydrophobic group R may include an alkyl chain in which a part of hydrogen atom(s) is substituted with fluorine atom, or an alkyl chain in which a part of carbon atom(s) is substituted with another atom. For example, the hydrophobic group R may include one or more selected from the group consisting of a hydrocarbon group, a fluoroalkyl group, a fluoro(poly)ether group, a fluoroalkoxy group, a fluoroacyl group, an alkoxy group, an acyl group, an alkylthio group, and an alkylamino group.

The hydrophobic group R is preferably a hydrocarbon group consisting of C and H. The hydrocarbon group may be either a saturated hydrocarbon group or an unsaturated hydrocarbon group. The hydrocarbon group may be an open chain hydrocarbon group or a cyclic hydrocarbon group such as an aromatic ring. The hydrophobic group R is preferably an open chain saturated hydrocarbon group, more preferably a straight-chain saturated hydrocarbon group. Since the open chain saturated hydrocarbon group is a flexible molecular chain, it is possible to cover the foundation without gaps and to improve water resistance. When the hydrocarbon group is an open chain hydrocarbon group, the number of carbons is preferably 6 or more to 25 or less, more preferably 10 or more to 18 or less. When the number of carbon atoms is large, the interaction among the molecules is large, so that it is possible to shorten the distance between the molecules in a self-assembled monolayer (SAM) described below, thereby resulting in making it possible to further improve the water resistance.

When the hydrophobic group R is a saturated hydrocarbon group (namely, an alkyl group), a part(s) of hydrogen atoms of the alkyl group may be substituted with another atom. The other atom is, for example, a halogen atom. The halogen atom is, for example, a fluorine atom. The alkyl group in which a part(s) of hydrogen atoms is(are) substituted with a fluorine atom(s) is, for example, a fluoroalkyl group. When the hydrophobic group A includes a fluoroalkyl group, the surface with high water-repellency can be obtained. As a side note, in order to obtain the high scale removability, it is preferable that the surface layer be free of a halogen atom. Furthermore, a part(s) of carbon atom(s) of the alkyl group may be substituted with another atom.

It is preferable that the high molecule compound and the low molecule compound include a functional group capable of bonding to a metal element. The functional group preferably includes one or more selected from the group consisting of a phosphonic acid group, a phosphoric acid group, a phosphinic acid group, a carboxy group, a silanol group (or a precursor of silanol such as an alkoxysilyl group), a β-diol group, an amino group, a hydroxy group, a hydroxyamide group, and an α- or a β-hydroxycarboxylic acid group. More preferably, a phosphonic acid group or a silanol group (or a precursor of silanol such as alkoxysilyl group) is included as the functional group. These functional groups are preferably bonded to a metal element contained in the colored layer 20 or the intermediate layer 30. In other words, it is preferable that the surface layer 40 be bonded to the colored layer 20 or the intermediate layer 30 through these functional groups.

Preferable Structure of Surface Layer

In the present invention, the surface layer 40 is a layer containing the hydrophobic group R and a functional group X with coordination to the metal element. The surface layer 40 is preferably a monolayer formed of a single layer, and is more preferably a self-assembled monolayer (SAM) formed of a non-polymeric organic ligand R—X described below. The self-assembled monolayer is a layer in which molecules are assembled densely, and is thus excellent in water-repellency. The thickness of the SAM is about the same as the length of one constituent molecule. Here, the "thickness" refers to the length of the SAM in a Z direction. Here, in FIG. 1, the Z direction is a direction from the base material 10 to the surface layer 40. The thickness of the SAM is 10 nm or less, preferably 5 nm or less, and more preferably 3 nm or less. In addition, the thickness of the SAM is 0.5 nm or more, and preferably 1 nm or more. In the case of using constituent molecules such that the thickness of SAM falls within such a range, it is possible to efficiently coat the base material 10, and to obtain a sanitary equipment part having excellent removability on pollutants including the scales.

Structure of SAM

In the present invention, the SAM is an aggregate of molecules formed on a surface of the intermediate layer 30 in the process of organic molecules adsorbing onto a surface of a solid, and the interaction between the molecules causes the molecules constituting the aggregate to densely aggregate. In the present invention, the SAM preferably contains an alkyl group. As a result, hydrophobic interaction acts between the molecules and allows the molecules to densely assemble, so that it is possible to obtain a sanitary equipment part having excellent stain removability.

Definition of Molecules Forming SAM

In a preferred embodiment of the present invention, the non-polymeric organic ligand R—X includes the hydrophobic group R and the functional group X with coordination to the metal element contained in the intermediate layer 30. The non-polymeric organic ligand R—X is bonded to the intermediate layer 30 through the functional group X. Here, the term "non-polymeric" refers to a compound that does not correspond to the definition 1.1 in the glossary (in Japanese translation) of basic terms in Polymer Science published by the International Union of Pure and Applied Chemistry (IUPAC) Commission on Polymer Nomenclature (that is, a molecule which has a large relative molecular mass and has a structure constituting of a large number of repetitions of units obtained substantially or conceptually from molecules having a small relative molecular mass, see http://main-.spsj.or.jp/c19iupac/Recommendations/glossary36.html).

The SAM is a layer formed of such a non-polymeric organic ligand R—X.

Non-Polymer Organic Ligand R—X

In a preferred embodiment of the present invention, the surface layer 40 is a layer formed using the non-polymeric organic ligand R—X. The hydrophobic group R preferably includes a hydrocarbon group consisting of C and H. An atom(s) other than carbon atom may be substituted at one or two positions in the skeleton of the hydrocarbon group included in the hydrophobic group R. The atom(s) to be substituted with the atom(s) other than carbon atom may be oxygen, nitrogen, or sulfur. Preferably, one end of the hydrophobic group R (i.e., an end that is not a bonding end to X) is a methyl group. As a result, the surface of the part 1 becomes water-repellent, thereby making it possible to improve the stain removability.

Examples of X

The functional group X is preferably at least one selected from a phosphonic acid group, a phosphoric acid group, a phosphinic acid group, a carboxylic group, a silanol group (or a precursor of silanol such as an alkoxysilyl group), a β-diol group, an amino group, a hydroxy group, a hydroxyamide group, and an α- or a β-hydroxycarboxylic acid group.

The carboxy group, the β-diol group, the amino group, the hydroxy group, the hydroxyamide group, and the α- or the β-hydroxycarboxylic acid group do not polymerize with one another, and are coordinated to (adsorbing to) the metal element contained in the intermediate layer 30; therefore, a dense surface layer is formed.

According to a preferred embodiment of the present invention, X is at least one kind selected from a phosphonic acid group, a phosphoric acid group, and a phosphinic acid group among the functional groups containing a phosphorus atom, and X is more preferably a phosphonic acid group. According to another preferred embodiment, X is a silanol group. Thus, a part with high water resistance and excellent removability on pollutants can be effectively obtained.

Structure of R—X

In the present invention, the surface layer 40 may be formed of two or more types of R—X. The surface layer formed of two or more types of R—X means a surface layer formed of multiple types of the above-mentioned compounds mixed therein. In addition, in the present invention, the surface layer 40 may contain a trace amount of organic molecules other than R—X as long as the scale removability is not impaired.

Examples of R—X

The organic phosphonic acid compound represented by the general formula R—X is preferably octadecylphosphonic acid, hexadecylphosphonic acid, dodecylphosphonic acid, decylphosphonic acid, octylphosphonic acid, hexylphosphonic acid, perfluorodecylphosphonic acid, perfluorohexylphosphonic acid, or perfluorooctylphosphonic acid, and more preferably octadecylphosphonic acid, hexadecylphosphonic acid, dodecylphosphonic acid, or decylphosphonic acid. Furthermore, octadecylphosphonic acid is much more preferable.

In R—X, phosphonic acid may be used as a molecule with a phosphonic acid group, (organic) phosphoric acid may be used as a molecule with a phosphoric acid group, phosphinic acid may be used as a molecule with a phosphinic acid group, carboxylic acid may be used as a molecule with a carboxy group, protocatechuic acid, gallic acid, dopa, or a catechol(orthohydroxyphenyl) group may be used as a molecule with a β-diol group, amino acid may be used as a molecule with an amino group, alcohol may be used as a molecule with a hydroxy group, hydroxamic acid may be used as a molecule with a hydroxyamide group, and salicylic acid or quinic acid may be used as a molecule with an (α- or a β-hydroxycarboxylic acid group.

In the present invention, the metal atom concentration of the surface layer 40 is preferably 1.0 at % or more to less than 10 at %. Adjusting the metal atom concentration within this range allows the surface layer 40 to be dense. Thus, the sanitary equipment part with sufficient water resistance and excellent scale removability can be obtained. More preferably, the metal atom concentration is 1.5 at % or more to less than 10 at %. Accordingly, the water resistance and the scale removability can be further enhanced.

In the present invention, in case the surface layer 40 contains the hydrocarbon group, the carbon atom concentration of the surface layer 40 is preferably 35 at % or more, more preferably 40 at % or more, much more preferably 43 at % or more, and the most preferably 45 at % or more. In addition, the carbon atom concentration is preferably less than 70 at %, more preferably 65 at % or less, and much more preferably 60 at % or less. The preferable range of the carbon atom concentration may be determined by the appropriate combination of these upper limit value and lower limit value. Adjusting the carbon atom concentration within this range can enhance the scale removability.

Thickness of Surface Layer

In the present invention, the surface layer 40 exhibits, in a profile obtained by the XPS depth direction analysis, a sputtering time of more than 0.5 minutes to 5 minutes or less, the sputtering time being a time taken from when the sputtering starts to when the metal atom contained in the intermediate layer starts to be detected. Here, the "profile obtained by the XPS depth direction analysis" means the profile obtained by the XPS depth direction analysis using the aforementioned "XPS measurement conditions" and "sputtering conditions 2". In this profile, the surface layer 40 exhibits a sputtering time of preferably 5 minutes or less, more preferably 3 minutes or less, the sputtering time being a time taken from the start of the sputtering from an end point of the surface layer 40, and the end point being defined, in a profile obtained by the XPS depth direction analysis, as a point where a difference of an absolute value between a carbon atom concentration at a certain measurement point and a carbon atom concentration at a measurement point just prior to the certain measurement point is 1.0 at % or less. The lower limit value of the sputtering time is preferably 1 minute or more. The preferable range may be determined by combining these upper limit value and lower limit value as appropriate. In this manner, the surface layer is a thin layer that is not visually recognizable, and can impart its function to the part while maintaining the color tone of the base material. In the XPS measurement, first, the water-repellency of the surface layer is confirmed, and the formation of the water-repellent surface layer is confirmed. It is preferable that three points be selected at random from the water-repellent surface layer 40 and be measured, and the average of these three points be determined to be the thickness of the surface layer 40.

Identification of Surface Layer

In the present invention, the surface of the part 1 is washed before the measurement to sufficiently remove the stains adhered onto the surface. For example, before the measurement, the surface of the part 1 is subjected to wipe washing with ethanol and sponge slide washing with a neutral detergent, and then thorough rinse washing with ultrapure water. In case the part 1 is a rough-surfaced part whose surface has been subjected to hairline processing, shot blasting, or the like, a portion with as high surface smoothness as possible is selected and measured. The portion with high smoothness, which diffuses light more than the rough portion, corresponds to the portion where L* obtained by the SCE method excluding a regular reflection component in the case of measuring the color difference using a spectrometer or the like is less than 5.

In the present invention, when the surface of the part 1 is analyzed, a portion having a relatively large radius of curvature is preferably selected from the surface of the part 1. It is preferable to use the part 1 that is cut into an analyzable size as a measurement sample. At the time of cutting, the portion to be analyzed or evaluated is preferably covered with a film or the like to prevent surface damage.

In the present invention, the surface layer 40 can be confirmed in detail through the following procedure. First, the water-repellency of the surface layer 40 is evaluated and the formation of the water-repellent surface layer is confirmed. As a method for evaluating the water-repellency, evaluation of a water droplet contact angle described below can be used, for example. The water-repellent surface layer is subjected to surface elemental analysis by XPS analysis, and thus the elements contained in the surface layer 40 are confirmed.

In the present invention, the fact that the surface layer 40 is a layer containing the hydrophobic group can be confirmed by checking the presence of the alkyl chain contained in the hydrophobic group in accordance with the following procedure. First, in the surface elemental analysis by the XPS analysis, it is confirmed that the peak at 284 to 285 eV derived from the C—C bond of the alkyl chain contained in the hydrophobic group is detected.

Next, the peak shift ($cm^{-1}$) derived from the hydrophobic group is confirmed using infrared spectroscopy or Surface Enhanced Raman Spectroscopy (SERS).

In the case of using the infrared spectroscopy, reflection absorption spectroscopy can be used. As a measurement device for the reflection absorption spectroscopy, a Fourier transformation infrared spectroscopy (FT-IR) device including an attachment (for example, Seagull manufactured by Harrick Scientific Products Inc.) capable of highly reflective measurement with the infrared ray incidence angle variable to 80° or more can be used. Examples of the infrared spectroscopy device include Cary 630IR (Agilent Technologies Japan, Ltd.) and Nicolet iS50 (Thermo Fisher Scientific K.K.).

The measurement using FT-IR in line with reflection absorption spectroscopy is conducted under the following conditions. Infrared ray incidence angle: 85°, detector: MCT detector, wavenumber resolution: 2 $cm^{-1}$, and cumulative number: 256.

First, only the base material (on which no layer such as the surface layer is formed) that is used in the sanitary equipment part to be measured is measured as a reference. Here, a plate material or the like formed of the same material as the base material to be measured may be used, as an alternative to the base material used in the sanitary equipment part. Then, by measuring the cutout sanitary equipment part 1, the IR spectrum is obtained. In the IR spectrum thus obtained, the horizontal axis represents wavenumber ($cm^{-1}$), and the vertical axis represents transmissivity or absorbance.

In the obtained IR spectrum, it can be confirmed that the surface layer 40 includes the hydrophobic group. The existence of the alkyl chain can be confirmed by detecting the wavenumbers derived from the methyl group of around 2960 $cm^{-1}$ and around 2930 $cm^{-1}$; and the wavenumbers derived from the alkyl chain ($—(CH_2)_n—$) of around 2850 $cm^{-1}$ and around 2920 $cm^{-1}$. In case the hydrophobic group includes the alkyl chain in which a part(s) of hydrogen atoms) is(are) substituted with fluorine, the existence of the alkyl chain in which the part(s) of hydrogen atom(s) is(are) substituted with fluorine can be confirmed by detecting the wavenumbers of around 1295 $cm^{-1}$, around 1200 $cm^{-1}$, and around 1150 $cm^{-1}$, In case of other hydrophobic groups, the wavenumbers corresponding thereto are checked. When an absorbance value is three times or more of the average of the absorbance values at 100 $cm^{-1}$ which is the minimum value in the measurement range, it is regarded that the corresponding wavenumber is detected and the existence of the corresponding hydrophobic groups is confirmed.

In the case of using surface enhanced Raman spectroscopy, a surface enhanced Raman spectroscopy analyzer including a transmission-type surface enhanced sensor (transmission type SERS sensor) and a confocal microscope Raman spectrometer is used. The transmission-type surface enhanced sensor may be, for example, the one described in Example 1 of JP 6179905 B. The confocal microscope Raman spectrometer may be, for example, NanoFinder30 (Tokyo Instruments Inc.).

The measurement method using the surface enhanced Raman spectroscopy is described below. The measurement is performed with a transmission-type surface enhanced sensor placed on the surface of the cutout sanitary equipment part 1. The measurement conditions are such that Nd:YAG laser (532 nm, 1.2 mW), scan time (10 seconds), grating (800 Grooves/mm), and pinhole size (100 µm). A Raman spectrum is obtained as a measurement result. In the Raman spectrum, the horizontal axis represents Raman shift ($cm^{-1}$) and the vertical axis represents signal intensity.

In the Raman spectrum thus obtained, the existence of the hydrophobic group can be confirmed by detecting the Raman shift derived from the methyl group of around 2930 $cm^{-1}$, and the Raman shift derived from the alkyl chain ($—(CH_2)_n—$) of around 2850 $cm^{-1}$ and around 2920 $cm^{-1}$. In case the hydrophobic group includes the alkyl chain in which a part(s) of hydrogen atom(s) is(are) substituted with fluorine, the existence of the alkyl chain in which the part(s) of hydrogen atom(s) is(are) substituted with fluorine can be confirmed by detecting the Raman shifts derived from ($—(CF_2)_n—$) of around 735 $cm^{-1}$ and around 1295 $cm^{-1}$. In case of other alkyl groups, the Raman shifts corresponding thereto are checked. It is regarded that the signal of the Raman shift is detected and the existence of the corresponding hydrophobic groups is confirmed when the signal has three times or more signal intensity than the average value of the signal intensities at 100 $cm^{-1}$ which is the minimum signal intensity in the measurement range.

Identification of Hydrophobic Group (R) and X when the Surface Layer is a Monolayer In the present invention, when the surface layer 40 is a layer containing the hydrophobic group R and the functional group X that can be bonded to the metal element, in particular, is a monolayer formed of a single layer, it is possible to identify that the surface layer 40 is the layer containing R and X by the following method.

First, the surface elemental analysis is conducted by XPS analysis and the elements contained in the surface layer 40 are confirmed.

Next, the molecular structure is identified by mass spectrometry from the mass-to-charge ratio (m/z) derived from the molecules of the components existing on the surface. For mass spectrometry, time-of-flight secondary ion mass spectrometry (TOF-SIMS) or high resolution mass spectrometry (HR-MS) can be used. Here, the high resolution mass spectrometry refers to a method capable of measurement with an accuracy of the mass resolution that is less than 0.0001 u (u: unified atomic mass units) or 0.0001 Da, and the elemental composition can be estimated from the precise mass. The HR-MS includes double-focusing mass spectrometry, time-of-flight tandem mass spectrometry (Q-TOF-MS), Fourier transform ion cyclotron resonance mass spectrometry (FT-ICR-MS), Orbitrap mass spectrometry, and the like, and time-of-flight tandem mass spectrometry (Q-TOF-MS) is employed in the present invention. For mass spectrometry, it is desirable to use HR-MS when sampling of R and X in a sufficient amount from the part 1 is possible. On the other hand, when sampling of R and X in a sufficient amount from the part is impossible due to the small size of the part 1 or the like, it is desirable to use TOF-SIMS. When mass spectrometry is used, the presence of R and X can be confirmed by detecting the ionic intensity of m/z corresponding to the ionized R and X. Here, it is regarded that an ionic intensity is detected when the ion intensity is three times or more than that of the average value of 50 Da before and after, centering on m/z, which is the lowest value in the range in which the ionic intensity is calculated in the measurement range.

TOF-SIMS Measurement Conditions when R and X in the Surface Layer are Recognized As the time-of-flight secondary ion mass spectrometry (TOF-SIMS) device, for example, TOF-SIMS 5 (manufactured by ION-TOF) is used. The measurement conditions are such that primary ions to be emitted: 209Bi3++, primary ion acceleration voltage 25 kV, pulse width 10.5 or 7.8 ns, bunching: on, electrification neutralization: off, post acceleration: 9.5 kV, measurement range (area): about 500*500 µm$^2$, secondary ions to be detected: Positive, Negative, Cycle Time: 110 µs, scan count 16. As a measurement result, a secondary ion mass spectrum (m/z) derived from R and X is obtained. In the secondary ion mass spectrum, the horizontal axis represents the mass-to-charge ratio (m/z), and the vertical axis represents the intensity of the detected ions (count).

HR/MS Measurement Conditions when R and X in the Surface Layer are Recognized

As the high resolution mass spectrometer, a time-of-flight tandem mass spectrometer (Q-TOF-MS), for example, Triple TOF 4600 (manufactured by SCIEX) is used. In the measurement, for example, the cutout base material is immersed in ethanol, and the component (R and X) used for forming the surface layer 40 is extracted with unnecessary components filtered, transferred to a vial (about 1 mL), and then measured. MS/MS measurement is performed under the measurement conditions, ion source: ESI/Duo Spray Ion Source, ion mode (Positive/Negative), IS voltage (−4500 V), source temperature (600° C.), DP (100 V), and CE (40 V), for example. As a measurement result, an MS/MS spectrum is obtained. In the MS/MS spectrum, the horizontal axis represents the mass-to-charge ratio (m/z), and the vertical axis represents the intensity of the detected ions (count).

Measurement of Atom Concentration of Each Layer

In the present invention, the composition of the surface layer 40, the intermediate layer 30, and the colored layer 20 is obtained by X-ray photoelectron spectroscopy (XPS). Before the measurement, the part 1 is subjected to sponge sliding with a neutral detergent and then to sufficient rinse-washing with ultrapure water. As the XPS device, PHI Quantera II (manufactured by ULVAC-PHI, Inc.) can be used. The respective elements contained in the surface layer 40, the intermediate layer 30, and the colored layer 20 are subjected to the XPS depth direction analysis using the "XPS measurement conditions" and "sputtering conditions 1" each described above, thereby obtaining the spectrum.

Next, the obtained spectrum is analyzed using data analysis software PHI MultiPak (manufactured by ULVAC-PHI, Inc.), and the concentration of the measured atoms is calculated. For the obtained spectrum, the Shirley method is carried out on the measured peaks based on the electron orbits of the atoms to remove the background, and thereafter the peak area intensity is calculated. Correction processing is performed by dividing the peak area intensity by the sensitive factors which is unique to the device and is pre-set in the data analysis software. After the correction processing, the concentration of each element is calculated in terms of at % from the ratio of the peak area of a certain element to the total peak area intensity of all the measured elements.

6. Properties of Part According to the Present Invention

In a preferred embodiment of the present invention, the lightness L* of the surface of the part 1 obtained by a spectrometer is less than 55, preferably less than 50, and more preferably less than 45. When the lightness is within this range, a part having a darker and blacker color can be obtained. In a preferred embodiment of the present invention, the absolute value of the chromaticity a* of the surface of the part 1 obtained by a spectrometer is less than 5, preferably less than 4. In a preferred embodiment of the present invention, the absolute value of b* of the surface of the part 1 obtained by a spectrometer is less than 5, preferably less than 4. Here, a* and b* are indices expressing the hue. It is noted that when a* increases in a positive (+) direction, the color becomes reddish, and when a* increases in a negative (−) direction, the color becomes greenish. When b* increases in a positive direction, the color becomes yellowish, and when b* increases in a negative direction, the color becomes bluish. When a* and b* are within this range, the part having high blackness can be obtained. When the color of the surface of the part 1 including the colored layer 20 differs by a certain degree or more, the color seems uneven. In view of this, in a preferred embodiment of the present invention, it is considered that, under the condition that an arbitrary measurement point is set as an original point, an arbitrary line passing the original point is set as X, and a line being perpendicular to X and passing the original point is set as Y, when the total of differences ΔL, Δa, and Δb between the maximum value and the minimum value of L*, a*, and b* at each of the four points: the original point; a point at a distance of 10±5 mm from the original point in the X direction; a point at a distance of 10±5 mm from the original point in the Y direction; and a point at a distance of 10±5 mm from the original point in the X direction and at a distance of 10±5 mm from the original point in the Y direction; is within 2.0, the surface is assessed as having "high color stability, while when the total of differences is 2.0 or more, the surface is assessed as having "low color stability."

The color tone of the colored layer 20, that is, the lightness and chromaticity of the surface of the colored layer 20 (part 1) are obtained by a spectrometer (for example, CM-2600d manufactured by KONICA MINOLTA, INC.). For example, L*, a*, and b* are measured with the SCI method including regular reflection light by pressing the spectrometer on a flat surface with measurement conditions: an observation light source D65, three times of averaging, a viewing angle of 10°, and a measurement diameter of 6 mm.

The hue of the colored layer 20 is obtained by the spectrometer (for example, CM-2600D manufactured by KONICA MINOLTA, INC.). For example, L*, a*, and b* are measured with the SCI method including regular reflection light by pressing the spectrometer on a flat surface with measurement conditions: an observation light source D65, three times of averaging, a viewing angle of 10°, and a measurement diameter of 6 mm.

It is noted that, as a spectrometer, the following spectrometer can be used, but not limited thereto.

Device: Spectrometer CM-2600D (manufactured by KONICA MINOLTA, INC.) Version; 1.42
Measurement parameters: SCI/SCE
Color system: L*a*b*, ΔE*
UV setting: UV 0%
Light source: D65
Observation angle of view: 10°
Measurement diameter: φ3 mm
Measurement wavelength intervals: 10 nm
Number of times of measurements: 3 times
Standby time before measurement: 0 seconds
Calibration: after zero calibration, white calibration (zero calibration: calibration in far space, white calibration: calibration with a white board for calibration)

In a preferred embodiment of the sanitary equipment part according to the present invention, the water droplet contact angle on the surface of the surface layer 40 is preferably 90° or more, more preferably 100° or more. The water droplet contact angle means a static contact angle, and is obtained by dropping 2 µL of water droplet on the surface layer 40 and photographing the water droplet after one second from the side surface of the base material. As the measurement device, for example, a contact angle meter (model number: SDMs-401, manufactured by Kyowa Interface Science Co., Ltd.) can be used.

Method for Manufacturing Part

In the present invention, the part 1 is manufactured by the steps of providing the base material 10, forming the colored layer 20 on the base material, optionally forming the intermediate layer 30, and further forming the surface layer 40. The colored layer 20 can be formed by, for example, physical vapor deposition (PVD). Before the surface layer 40 is formed, a surface of the colored layer 20 is preferably subjected to pre-treatment. The pre-treatment for removing stains on the surface may include cleaning with a neutral detergent, UV ozone treatment, alkali treatment, or the like.

EXAMPLES

The present invention is described in more detail with reference to the following examples. The present invention, however, is not limited to these examples.

1. Manufacture of Part

<Base Material>

As base materials, a brass flat plate plated with nickel chromium, and a three-dimensional object (manufactured by TOTO LTD., product name: TLG02302J) were manufactured.

<Formation of Colored Layer>

On the base materials with a surface cleaned in advance, a colored layer having a black surface was formed by physical vapor deposition (PVD).

By the PVD method, a colored layer (film) having black color was formed. During the formation of the film, the film formation conditions were controlled so that the base material had a temperature of 100° C. or more to 250° C. or less, and the base materials were rotated and/or revolved. In spite of that the PVD method was employed, components for the layer were uniformly filmed even on the three-dimensional object because the base materials were subject to rotation and revolution. As for rotation and revolution of the base materials, either rotation or revolution may be employed, but it is preferable that rotation and revolution be performed at the same time.

As for the sputtering species, a metal target was used and by adjusting the output of the sputtering and the gas flow rate of argon/nitrogen/acetylene, a plurality of types of colored layers with different compositions were manufactured.

<Formation of Intermediate Layer>

In the same manner as the method for forming the colored layer, a plurality of types of intermediate layers with different compositions were formed by adjusting the output of the sputtering and the gas flow rate of argon/oxygen.

<Formation of Surface Layer>

The base materials formed thereon the intermediate layer and the colored layer were immersed in a sodium hydroxide aqueous solution for a predetermined time, and thereafter were sufficiently rinse-washed with ion-exchanged water.

As a treatment agent for forming a surface layer, a solution in which octadecylphosphonic acid (manufactured by Tokyo Chemical Industry Co., Ltd., product code O0371) was dissolved in ethanol (manufactured by FUJIFILM Wako Pure Chemical Corporation, Wako 1st Grade) was used. The base materials were immersed in the treatment agent for a predetermined time, and were washed with ethanol. The immersion time was 1 minute or more. Thereafter, the base materials were dried in a drier for 10 minutes at 120° C. to form the surface layer on the surfaces of the base materials.

A nonwoven fabric (product name: BEMCOT M3-II, manufactured by Asahi Kasei Corporation) was impregnated with a solution in which silicone primer (product name: KBM403, manufactured by Shin-Etsu Chemical Co., Ltd.) was dissolved in isopropyl alcohol (manufactured by FUJIFILM Wako Pure Chemical Corporation) as a treatment agent for an intermediate layer for forming a polymer-based surface layer, and the solution was spread over the entirety of the base materials, and thereafter, the resulting base materials were dried naturally for 10 minutes to form thereon the intermediate layer.

As a treatment agent for forming a surface layer, a coating agent containing an alkyl fluoride group (product name: SURECO2101S, manufactured by AGC Inc.) was used. A nonwoven fabric (product name: BEMCOT M3-II, manufactured by Asahi Kasei Corporation) was impregnated with the treatment agent, and the treatment agent was spread over the entirety of the surface of the intermediate layer. Thereafter, the resulting layers were dried in a drier for 30 minutes at 120° C. to form the surface layer.

A nonwoven fabric (product name: BEMCOT M3-II, manufactured by Asahi Kasei Corporation) was impregnated with a solution in which silicone primer (product name: KBM403, manufactured by Shin-Etsu Chemical Co., Ltd.) was dissolved in isopropyl alcohol (manufactured by FUJIFILM Wake Pure Chemical Corporation) as a treatment agent for an intermediate layer for forming a polymer-based surface layer, and the solution was spread over the entirety of the base materials, and thereafter, the resulting base materials were dried naturally for 10 minutes to form the intermediate layer.

As a treatment agent for forming a surface layer, a polymer compound having a silanol group at a terminal end and having perfluoropolyether in a part of a molecular chain (silane compound containing a perfluoropolyether group) was used. A nonwoven fabric (product name: BEMCOT M3-II, manufactured by Asahi Kasei Corporation) was impregnated with the treatment agent, and the treatment agent was spread over the entirety of the surface of the intermediate layer. Thereafter, the resulting layers were dried in a drier for 30 minutes at 120° C. to form the surface layer.

2. Analysis and Evaluation

Each of the parts manufactured as described above was subjected to the following analyses and evaluations.

<Sampling>

In the analysis and evaluation of the flat plate part, a 3 cm-square region at a central portion of the flat plate was set as the evaluation surface. In the analysis and evaluation of the three-dimensional object (manufactured by TOTO LTD., product name: TLG02302J), a surface which is a visible portion when the object was placed and which is as smooth as possible was set as the evaluation surface. Specifically, from an upper surface of a spout part parallel to the ground when the object was attached, a 3 cm-square region near the center was cut, and the resulting surface was set as the evaluation surface in the following evaluation.

<Composition of Colored Layer>

Regarding the composition of the colored layer, a composition in a depth region after 8 minutes from when the atomic ratio of Cr, Zr, or Si exceeds the atomic ratio of C, in the profile obtained by the XPS depth direction analysis using the "XPS measurement conditions" and "sputtering conditions 1" described above was set as the composition of the colored layer. Before the measurement, each part was cleaned by rubbing with a urethane sponge using a neutral detergent, and was then sufficiently rinse-washed with ultrapure water.

In the XPS measurement of the three-dimensional object, in order to avoid the failure of measurement due to the collision between a detector and the sample, a surface opposite to the measurement surface was adjusted by polishing or the like so that the measurement point was a high position in the measurement surface (within 1 mm from the maximum height of the sample).

<Existence Confirmation of Oxide in Intermediate Layer>

The existence of the oxide in the intermediate layer was confirmed by the XPS depth direction analysis using the "XPS measurement conditions" and "sputtering conditions 1" described above. In the profile obtained by the XPS depth direction analysis, O1s derived from metal oxide had a peak at 530 to 532 eV, and the bond between the metal atom and the oxygen atom was confirmed depending on whether the peak existed at 576-580 eV for Cr2p3, 182-183 eV for Zr3d, and 103-104 eV for Si2p.

<Confirmation of Sputtering Time for Intermediate Layer>

As the sputtering time for the intermediate layer, a sputtering time taken from when the metal element was detected to when the amount of detected oxygen elements contained in the intermediate layer exceeded the amount of detected oxygen elements (O) contained in the colored layer, in the XPS depth direction analysis using the "XPS measurement conditions" and "sputtering conditions 1" described above was used.

<Confirmation of Sputtering Time for Surface Layer>

As the sputtering time for the surface layer, a sputtering time taken from the start of the sputtering to an end point of the surface layer, wherein the end point was set as a point where the metal atom contained in the intermediate layer started to be detected, in the profile obtained by the XPS depth direction analysis using the "XPS measurement conditions" and "sputtering conditions 2" described above, was used.

<Measurement of Color Tone>

The color tone of each part was measured using the spectrometer (CM-2600D manufactured by KONICA MINOLTA, INC.). Before the measurement, white calibration was performed using a calibration plate. Thereafter, for each part, the color tone or hue was measured at three positions avoiding clearly visible damage or stain, and the average value of the measurement parameters L*, a*, and b* was calculated.

It is noted that the details of the spectrometer used is as follows.

Device: Spectrometer CM-2600D (manufactured by KONICA MINOLTA, INC.)
Version: 1.42
Measurement parameters: SCI/SCE
Color system: L*a*b*, ΔE*
UV setting: UV 0%
Light source: D65
Observation angle of view: 10°
Measurement diameter: φ3 mm
Measurement wavelength intervals: 10 nm
Number of times of measurements: 3 times
Standby time before measurement: 0 seconds
Calibration: after zero calibration, white calibration (zero calibration: calibration in far space, white calibration: calibration with a white board for calibration)

<Blackness>

The part with L* of less than 55 was given "○", and the surface thereof was evaluated as "blackness is high". The part with L* of less than 50 was given "⊚", and the surface thereof was evaluated as "blackness is higher". On the other hand, the part(s) other than those above was(were) given "x", and the surfaces thereof was(were) evaluated as "blackness is low".

<Chromaticity>

The part with absolute value of a* was less than 5 and with absolute value of b* was less than 5 was given "○", and the surface thereof was evaluated as "hue is good". The part with absolute value of a* was less than 4 and with absolute value of b* was less than 4 was given "⊚", and the surface thereof was evaluated as "hue is better". On the other hand, the part(s) other than those above was(were) given "x", and the surfaces thereof was(were) evaluated as "hue is not good".

<Color Stability>

An arbitrary measurement point was set as an original point, an arbitrary line passing the original point was set as X, and a line being perpendicular to X and passing the original point was set as Y. Furthermore, the four points: the original point; a point at a distance of 10±5 mm from the original point in the X direction; a point at a distance of 10±5 mm from the original point in the Y direction; and a point at a distance of 10±5 mm from the original point in the X direction and at a distance of 10±5 mm from the original point in the Y direction; were set. When the total of differences ΔL, Δa, and Δb between the maximum value and the minimum value of L*, a*, and b* at each of the four points is within 2.0, the surface of the part was assessed as "high color stability, and was given "○", while when the total of differences is 2.0 or more, the surface of the part was assessed as "low color stability", and was given "x".

<Water Droplet Contact Angle>

Before the measurement, each part was cleaned by rubbing with a urethane sponge using an alkali detergent, and then was sufficiently rinsed with ultrapure water. A contact angle meter (model number: SDMs-401, manufactured by Kyowa Interface Science Co., Ltd.) was used for measuring the water droplet contact angle of each part. Ultrapure water was used as a water for the measurement, and the size of the water droplet to be dropped was 2 μl. The contact angle was a so-called static contact angle, which was set to the value one second after the water was dropped, and the average value of those measured at five different sites was obtained. As a side note, a value that deviates by ±20° or more from an average value of those measured at four sites among the five sites is regarded as an abnormal value, and when a site expressing the abnormal value appeared among the five sites, the average value was calculated by excluding the abnormal value. The results are shown in Table 1.

<Thickness of Colored Layer>

The thickness of the colored layer of each part was obtained by the following method. First, an arbitrary point on a design surface of the part including the colored layer (the design surface referring to a visible portion when the part is placed as a product, excluding an invisible portion) was cut in a direction perpendicular to the colored layer 20 (in the Z direction shown in FIG. 1). The resulting surface was polished using abrasive paper of #400 and abrasive paper of #1500 in this order, and thereafter, was milled using an ion milling device to obtain a smooth cross section. This cross section was observed by scanning electron microscope/energy dispersive X-ray spectroscopy (SEM/EDX), the colored layer and the base material were identified. The observation was performed at the observation magnification of 25000, and a SEM image was acquired so that the interface between the colored layer and the base material exists within the SEM image, and the interface is horizontal. By performing the mapping analysis with EDX on the SEM image, a boundary surface where the different element distribution was confirmed was confirmed, from element C contained in the colored layer and element Cr contained in the base material. The boundary surface was identified as the interface between the colored layer and the base material. A line that vertically halves the acquired SEM image was set as a center, and in parallel to the line, two lines were drawn at equal intervals in each of left and right sides of the center line. Points where each of the total of five vertical lines drawn in the SEM image intersects with the boundary surface between the colored layer and the base material and with a surface of the colored layer on the opposite side to the base material were obtained. The length of each of the five vertical line segments in the SEM image that was fractionated by the two intersections was measured, and the average value of the lengths of the five line segments was set as the thickness of the colored layer 20.

The results of the above measurements and evaluations are shown in Tables 1 and 2.

Confirmation of Hydrophobic Group in Surface Layer

By the following method, it was confirmed that the surface layer contained the hydrophobic group. It was confirmed using the surface enhanced Raman spectroscopy. As the surface enhanced Raman spectroscopy analyzer, the following analyzer was used. As the surface enhanced Raman sensor, a transmission-type surface enhanced Raman sensor described in Example 1 of JP 6179905 B was used. As the confocal microscope Raman spectrometer, NanoFinder30 (Tokyo Instruments Inc.) was used. In the measurement, the transmission-type surface enhanced Raman sensor was disposed on the surface of the cutout sample. The measurement conditions were such that Nd:YAG laser (532 nm, 1.2 mW), scan time (10 seconds), grating (800 Grooves/mm), and pinhole size (100 μm).

In Examples 1 to 3, and 5 to 15, the signal peaks were detected in the Raman shifts 2850 $cm^{-1}$ and 2920 $cm^{-1}$ each derived from $—(CH_2)_n—$ included in the alkyl chain. In Examples 4, and 16 to 20, the signal peaks were detected in the Raman shifts 735 $cm^{-1}$ and 1295 $cm^{-1}$ each derived from $—(CF_2)_n—$ included in the alkyl chain in which parts of hydrogen atoms were substituted with fluorine.

TABLE 1

| | | | | Example 1 | Example 2 | Example 3 | Example 4 | Example 5 | Example 6 |
|---|---|---|---|---|---|---|---|---|---|
| Structure of part | Base material | | | Flat plate | Flat plate | Flat plate | Flat plate | Flat plate | Flat plate |
| | Colored layer | Composition (at %) | C | 51.9 | 93.2 | 50.8 | 78.6 | 99.0 | 55.1 |
| | | | Cr | 31.4 | 0.2 | 32.2 | 6.9 | 0.0 | 22.5 |
| | | | N | 13.3 | 5.3 | 13.5 | 7.6 | 0.0 | 9.2 |
| | | | O | 3.4 | 1.3 | 3.5 | 6.7 | 1.0 | 13.2 |
| | Intermediate layer | Detected metal element | | Cr | Cr | Cr | Si | Cr | Zr |
| | | Metal element in oxidized state | | Cr | Cr | Cr | Si | Cr | Zr |
| | | Sputtering time/min*1 | | 1.5 | 1.5 | 5.0 | 0.5 | 1.5 | 1.5 |
| | Surface layer | Material | | Alkyl-phosphonic acid | Alkyl-phosphonic acid | Alkyl-phosphonic acid | Alkyl fluoride polymer | Alkyl-phosphonic acid | Alkyl-phosphonic acid |
| | | Sputtering time/min*2 | | 1 | 1 | 1 | 3 | 1 | 1 |
| Evaluation of part | Color tone (Hue) | Blackness | | ○ | ◎ | ○ | ◎ | ◎ | ◎ |
| | | L* | | 51.8 | 34.7 | 52.3 | 38.4 | 34.6 | 46.9 |
| | | Chromaticity | | ◎ | ◎ | ◎ | ◎ | ◎ | ◎ |
| | | a* | | 0.2 | 0.3 | 0.4 | 0.1 | 0.1 | 0 |
| | | b* | | 2.3 | 0.8 | 2.6 | 1.1 | 0.2 | 2.1 |
| | | Maximum L* − minimum L* of four points | | 0.54 | 0.61 | 0.68 | 0.41 | 0.21 | 0.26 |
| | | Maximum a* − minimum a* of four points | | 0.42 | 0.34 | 0.55 | 0.44 | 0.12 | 0.20 |
| | | Maximum b* − minimum b* of four points | | 0.44 | 0.4 | 0.31 | 0.44 | 0.67 | 0.88 |
| | | Total of the above differences | | 1.40 | 1.35 | 1.54 | 1.29 | 1.00 | 1.34 |
| | | Color stability | | ○ | ○ | ○ | ○ | ○ | ○ |
| | | Thickness of colored layer (μm) | | 1.4 | 1.2 | 1.5 | 1.3 | 1.1 | 1.2 |
| | Water repellency | Water contact angle(°) | | 103 | 101 | 110 | 115 | 111 | 109 |
| | | Water repellency (Water contact angle 90° or more) | | ○ | ○ | ○ | ○ | ○ | ○ |

TABLE 1-continued

|  |  |  |  | Example 7 | Example 8 | Example 9 | Example 10 | Example 11 | Example 12 |
|---|---|---|---|---|---|---|---|---|---|
| Structure of part | Base material |  |  | 3D object | Flat plate | Flat plate | Flat plate | Flat plate | Flat plate |
|  | Colored layer | Composition (at %) | C | 74.6 | 50.8 | 50.8 | 99.0 | 99.0 | 50.8 |
|  |  |  | Cr | 8.5 | 32.2 | 32.2 | 0.0 | 0.0 | 32.2 |
|  |  |  | N | 9.1 | 13.5 | 13.5 | 0.0 | 0.0 | 13.5 |
|  |  |  | O | 7.9 | 3.5 | 3.5 | 1.0 | 1.0 | 3.5 |
|  | Intermediate layer | Detected metal element |  | Cr | Cr | Cr | Cr | Cr | Zr |
|  |  | Metal element in oxidized state |  | Cr | Cr | Cr | Cr | Cr | Zr |
|  |  | Sputtering time/min*1 |  | 1.5 | 0.7 | 6.2 | 0.7 | 7 | 0.8 |
|  | Surface layer | Material |  | Alkyl-phosphonic acid | Alkyl-phosphonic acid | Alkyl-phosphonic acid | Alkyl-phosphonic acid | Alkyl-phosphonic acid | Alkyl-phosphonic acid |
|  |  | Sputtering time/min*2 |  | 1 | 1 | 1 | 1 | 1 | 1 |
| Evaluation of part | Color tone (Hue) | Blackness |  | ◎ | ○ | ◎ | ◎ | ◎ | ◎ |
|  |  | L* |  | 38.7 | 50.3 | 48.3 | 34.6 | 32 | 49 |
|  |  | Chromaticity |  | ◎ | ◎ | ○ | ◎ | ○ | ◎ |
|  |  | a* |  | 0.2 | 1.4 | 0.4 | 0.1 | 0.3 | 1.1 |
|  |  | b* |  | 1.1 | 2.9 | −4.9 | 0.2 | −4.6 | 2.1 |
|  |  | Maximum L* − minimum L* of four points |  | 0.33 | 0.40 | 0.68 | 0.21 | 0.40 | 0.21 |
|  |  | Maximum a* − minimum a* of four points |  | 0.20 | 0.10 | 0.55 | 0.12 | 0.10 | 0.21 |
|  |  | Maximum b* − minimum b* of four points |  | 0.64 | 0.20 | 0.31 | 0.67 | 0.24 | 0.44 |
|  |  | Total of the above differences |  | 1.17 | 0.7 | 1.5 | 1.0 | 0.7 | 0.9 |
|  |  | Color stability |  | ○ | ○ | ○ | ○ | ○ | ○ |
|  |  | Thickness of colored layer (μm) |  | 2.0 | 1.5 | 1.5 | 1.0 | 1.0 | 1.5 |
|  | Water repellency | Water contact angle(°) |  | 108 | 96 | 110 | 111 | 110 | 99 |
|  |  | Water repellency (Water contact angle 90° or more) |  | ○ | ○ | ○ | ○ | ○ | ○ |

*1 Sputtering time taken from when metal element is detected to when the amount of detected oxygen elements exceeds the amount of detected oxygen elements (O) contained in colored layer, with XPS depth direction analysis
*2 Sputtering time taken from when sputtering starts to when metal atom contained in intermediate layer starts to be detected, in profile obtained by XPS depth direction analysis

TABLE 2

|  |  |  |  | Example 13 | Example 14 | Example 15 | Example 16 | Example 17 | Example 18 |
|---|---|---|---|---|---|---|---|---|---|
| Structure of part | Base material |  |  | Flat plate | Flat plate | Flat plate | Flat plate | Flat plate | Flat plate |
|  | Colored layer | Composition (at %) | C | 50.8 | 99.0 | 99.0 | 50.8 | 50.8 | 99.0 |
|  |  |  | Cr | 32.2 | 0.0 | 0.0 | 32.2 | 32.2 | 0.0 |
|  |  |  | N | 13.5 | 0.0 | 0.0 | 13.5 | 13.5 | 0.0 |
|  |  |  | O | 3.5 | 1.0 | 1.0 | 3.5 | 3.5 | 1.0 |
|  | Intermediate layer | Detected metal element |  | Zr | Zr | Zr | Si | Si | Si |
|  |  | Metal element in oxidized state |  | Zr | Zr | Zr | Si | Si | Si |
|  |  | Sputtering time/min*1 |  | 7 | 0.9 | 7 | 0.7 | 9 | 0.8 |
|  | Surface layer | Material |  | Alkyl-phosphonic acid | Alkyl-phosphonic acid | Alkyl-phosphonic acid | Silane compound containing perfluoropoly-ether group | Silane compound containing perfluoropoly-ether group | Silane compound containing perfluoropoly-ether group |
|  |  | Sputtering time/min*2 |  | 1 | 1 | 1 | 3 | 3 | 3 |
| Evaluation of part | Color tone (Hue) | Blackness |  | ◎ | ◎ | ◎ | ◎ | ◎ | ◎ |
|  |  | L* |  | 49.8 | 33.2 | 30.5 | 49.8 | 47.5 | 34.4 |
|  |  | Chromaticity |  | ○ | ◎ | ◎ | ◎ | ○ | ◎ |

TABLE 2-continued

|  |  |  |  |  |  |  |  |  |
|---|---|---|---|---|---|---|---|---|
|  |  | a* |  | 0.1 | −0.1 | 0.4 | 0.9 | 1.1 | 0.1 |
|  |  | b* |  | −4.2 | 0.2 | −3.9 | 2.1 | −4.1 | 0.4 |
|  |  | Maximum L* − minimum L* of four points |  | 0.56 | 0.55 | 0.13 | 0.31 | 0.32 | 0.47 |
|  |  | Maximum a* − minimum a* of four points |  | 0.32 | 0.20 | 0.41 | 0.10 | 0.23 | 0.19 |
|  |  | Maximum b* − minimum b* of four points |  | 0.60 | 0.56 | 0.11 | 0.44 | 0.51 | 0.47 |
|  |  | Total of the above differences |  | 1.5 | 1.3 | 0.7 | 0.9 | 1.1 | 1.1 |
|  |  | Color stability |  | ○ | ○ | ○ | ○ | ○ | ○ |
|  |  | Thickness of colored layer (μm) |  | 1.5 | 1.0 | 1.0 | 1.5 | 1.5 | 1.0 |
|  | Water repellency | Water contact angle(°) |  | 106 | 100 | 104 | 106 | 115 | 109 |
|  |  | Water repellency (Water contact angle 90° or more) |  | ○ | ○ | ○ | ○ | ○ | ○ |

|  |  |  |  | Example 19 | Example 20 | Comparative example 1 | Comparative example 2 | Comparative example 3 | Comparative example 4 |
|---|---|---|---|---|---|---|---|---|---|
| Structure of part | Base material |  |  | Flat plate | Flat plate | Flat plate | Flat plate | Flat plate | Flat plate |
|  | Colored layer | Composition (at %) | C | 99.0 | 50.8 | 65.5 | 50.8 | 74.6 | 38.4 |
|  |  |  | Cr | 0.0 | 32.2 | 19.9 | 32.7 | 8.5 | 42.5 |
|  |  |  | N | 0.0 | 13.5 | 12.0 | 13.1 | 9.1 | 15.4 |
|  |  |  | O | 1.0 | 3.5 | 2.7 | 3.4 | 7.9 | 3.7 |
|  | Intermediate layer | Detected metal element |  | Si | Si | Cr | Cr | Cr | Cr |
|  |  | Metal element in oxidized state |  | Si | Si | Cr | Cr | Cr | Cr |
|  |  | Sputtering time/min*1 |  | 7 | 5 | 0.0 | 10.5 | 1.5 | 3.0 |
|  | Surface layer | Material |  | Silane compound containing perfluoropolyether group | Silane compound containing perfluoropolyether group | Alkylphosphonic acid | Alkylphosphonic acid | None | Alkylphosphonic acid |
|  |  | Sputtering time/min*2 |  | 3 | 1 | 0 | 1 | N.D. | 1 |
| Evaluation of part | Color tone (Hue) | Blackness |  | ⊚ | ⊚ | ⊚ | ⊚ | ⊚ | X |
|  |  | L* |  | 30.1 | 49.8 | 45.5 | 30.2 | 39.2 | 57.2 |
|  |  | Chromaticity |  | ⊚ | ⊚ | ⊚ | X | ⊚ | ⊚ |
|  |  | a* |  | 0.6 | 0.9 | 0.2 | −3.8 | 0.2 | 1.1 |
|  |  | b* |  | −3.8 | 0.1 | 1.6 | −24.5 | 1.1 | 3.5 |
|  |  | Maximum L* − minimum L* of four points |  | 0.80 | 0.40 | 0.10 | 3.16 | 0.24 | 0.4 |
|  |  | Maximum a* − minimum a* of four points |  | 0.50 | 0.20 | 0.50 | 1.85 | 0.20 | 0.2 |
|  |  | Maximum b* − minimum b* of four points |  | 0.60 | 0.30 | 0.74 | 1.25 | 0.81 | 0.2 |
|  |  | Total of the above differences |  | 1.9 | 0.9 | 1.34 | 6.26 | 1.25 | 0.8 |
|  |  | Color stability |  | ○ | ○ | ○ | X | ○ | ○ |
|  |  | Thickness of colored layer (μm) |  | 1.0 | 1.5 | 1.3 | 1.5 | 1.2 | 1.3 |
|  | Water repellency | Water contact angle(°) |  | 111 | 114 | 74 | 110 | 76 | 110 |
|  |  | Water repellency (Water contact angle 90° or more) |  | ○ | ○ | X | ○ | X | ○ |

*1 Sputtering time taken from when metal element is detected to when the amount of detected oxygen elements exceeds the amount of detected oxygen elements (O) contained in colored layer, with XPS depth direction analysis
*2 Sputtering time taken from when sputtering starts to when metal atom contained in intermediate layer starts to be detected, in profile obtained by XPS depth direction analysis

REFERENCE SIGNS LISTS

1: Part
10: Base material
10a: Support member of Base material 10
10b: One region of Base material 10
20: Colored layer
30: intermediate layer
40: Surface layer

The invention claimed is:

1. A sanitary equipment part comprising at least a base material, a colored layer on the base material, an intermediate layer on the colored layer, and a surface layer on the intermediate layer, as the uppermost layer, wherein
the colored layer is a layer comprising a carbon atom (C) and an oxygen atom (O), and optionally, a chromium atom (Cr) and/or a nitrogen atom (N),
the colored layer contains:
more than 35 at % to 99 at % or less of C,
0 at % or more to less than 40 at % of Cr,
0 at % or more to less than 15 at % of N, and
more than 0 at % to less than 15 at % of O,
provided that the total of C, O, Cr, and N is 100 at %,
in a profile obtained by an XPS depth direction analysis, in a depth region after 8 minutes from when an atomic ratio of Cr, Zr, or Si, defined as (Cr, Zr, or Si)/(C+Cr+N+O), for the first time exceeds that of C/(C+Cr+N+O),
the profile obtained by the XPS depth direction analysis is a profile obtained by XPS measurements carried out under the following XPS measurement conditions and Sputtering conditions 1,
XPS measurement conditions being as follows:
X-ray condition: monochromatic AlKα ray (output 25 W),
Photoelectron take-off angle: 45°,
Analysis area: 100 amp, and
Element to be analyzed (energy range): Zr3d (177-187 eV), C1s (281-296 eV), N1s (394-406 eV), O1s (524-540 eV), Cr2p3 (572-582 eV), Si2p (98-108 eV),
Sputtering conditions 1 being as follows:
Inert gas species: Ar,
Angle of incidence: 45°,
Sputtering voltage: 4 KV,
Sputtering range: 2 mm*2 mm,
Sputtering cycle: 10 seconds; and
the intermediate layer contains not only at least one metal atom selected from Cr, Zr, and Si but also an oxygen atom,
the metal atom in an oxidized state is detected with XPS in the intermediate layer,
the intermediate layer exhibits a sputtering time of 0.5 minutes to 9 minutes, both inclusive, the sputtering time being a time taken from when the metal atom is detected to when the amount of the detected oxygen atoms contained in the intermediate layer for the first time exceeds the amount of the detected oxygen atoms (O) contained in the colored layer, with an XPS depth direction analysis,
the XPS depth direction analysis is carried out under the following XPS measurement conditions and Sputtering conditions 1, and by using an XPS device with
XPS measurement conditions being as follows:
X-ray condition: monochromatic AlKα ray (output 25 W),
Photoelectron take-off angle: 45°,
Analysis area: 100 amp, and
Element to be analyzed (energy range): Zr3d (177-187 eV), C1s (281-296 eV), N1s (394-406 eV), O1s (524-540 eV), Cr2p3 (572-582 eV), Si2p (98-108 eV),
Sputtering conditions 1 being as follows:
Inert gas species: Ar,
Angle of incidence: 45°,
Sputtering voltage: 4 KV,
Sputtering range: 2 mm*2 mm,
Sputtering cycle: 10 seconds; and
the surface layer
is water-repellent, and
includes a hydrophobic group, wherein the hydrophobic group includes an alkyl chain, or includes an alkyl chain in which a part of hydrogen atom(s) may be substituted with fluorine atom, or includes an alkyl chain in which a part of carbon atom(s) may be substituted with another atom, and
exhibits, in a profile obtained by the XPS depth direction analysis, a sputtering time of 0.5 minutes exclusive to 5 minutes inclusive, the sputtering time being a time taken from when the sputtering starts to when the metal atom contained in the intermediate layer starts to be detected,
the profile obtained by the XPS depth direction analysis is a profile obtained by XPS measurements carried out under the following XPS measurement conditions and Sputtering conditions 2,
XPS measurement conditions being as follows:
X-ray condition: monochromatic AlKα ray (output 25 W),
Photoelectron take-off angle: 45°,
Analysis area: 100 amp, and
Element to be analyzed (energy range): Zr3d (177-187 eV), C1s (281-296 eV), N1s (394-406 eV), O1s (524-540 eV), Cr2p3 (572-582 eV), Si2p (98-108 eV),
Sputtering conditions 2 being as follows:
Inert gas species: Ar,
Angle of incidence: 45°,
Sputtering voltage: 500 V,
Sputtering range: 2 mm*2 mm,
Sputtering cycle: 1 minute; and
the surface layer contains a functional group capable of bonding to the metal atom contained in the intermediate layer, and is bonded to the intermediate layer through the functional group.

2. The sanitary equipment part according to claim 1, wherein the colored layer contains:
more than 50 at % to 99 at % or less of C,
0 at % or more to less than 35 at % of Cr,
0 at % or more to less than 15 at % of N, and
1 at % to less than 15 at % of O.

3. The sanitary equipment part according to claim 2, wherein the sputtering time in the surface layer is more than 0.5 minutes to 3 minutes or less.

4. The sanitary equipment part according to claim 2 wherein a lightness L* value of the surface of the part is less than 55, the lightness L* value being obtained by a spectrometer device and under the following spectrometric measurement conditions:
Measurement parameters: SCI/SCE,
Color system: L*a*b*, AE*,
UV setting: UV 0%,
Light source: D65,
Observation angle of view: 10°, Measurement diameter: φ3 mm,
Measurement wavelength intervals: 10 nm,
Number of times of measurements: 3 times,
Standby time before measurement: 0 seconds, and
Calibration: after zero calibration, white calibration (zero calibration: calibration in far space, white calibration: calibration with a white board for calibration).

5. The sanitary equipment part according to claim 2, wherein the thickness of the surface layer is smaller than that of the intermediate layer.

6. The sanitary equipment part according to claim 2, wherein the surface layer is a monolayer.

7. The sanitary equipment part according to claim 2, wherein the thickness of the colored layer is 0.5 μm to 4 μm, both inclusive.

8. The sanitary equipment part according to claim 1, wherein the sputtering time in the surface layer is more than 0.5 minutes to 3 minutes or less.

9. The sanitary equipment part according to claim 8 wherein a lightness L* value of the surface of the part is less than 55, the lightness L* value being obtained by a spectrometer device and under the following spectrometric measurement conditions:
Measurement parameters: SCI/SCE,
Color system: L*a*b*, ΔE*,
UV setting: UV 0%,
Light source: D65,
Observation angle of view: 10°,
Measurement diameter: φ3 mm,
Measurement wavelength intervals: 10 nm,
Number of times of measurements: 3 times,
Standby time before measurement: 0 seconds, and
Calibration: after zero calibration, white calibration (zero calibration: calibration in far space, white calibration: calibration with a white board for calibration).

10. The sanitary equipment part according to claim 8, wherein the thickness of the surface layer is smaller than that of the intermediate layer.

11. The sanitary equipment part according to claim 8, wherein the surface layer is a monolayer.

12. The sanitary equipment part according to claim 8, wherein the thickness of the colored layer is 0.5 μm to 4 μm, both inclusive.

13. The sanitary equipment part according to claim 1, wherein a lightness L* value of the surface of the part is less than 55, the lightness L* value being obtained by a spectrometer device and under the following spectrometric measurement conditions:
Measurement parameters: SCI/SCE,
Color system: L*a*b*, ΔE*,
UV setting: UV 0%,
Light source: D65,
Observation angle of view: 10°,
Measurement diameter: φ3 mm,
Measurement wavelength intervals: 10 nm,
Number of times of measurements: 3 times,
Standby time before measurement: 0 seconds, and
Calibration: after zero calibration, white calibration (zero calibration: calibration in far space, white calibration: calibration with a white board for calibration).

14. The sanitary equipment part according to claim 1, wherein the thickness of the surface layer is smaller than that of the intermediate layer.

15. The sanitary equipment part according to claim 1, wherein the surface layer is a monolayer.

16. The sanitary equipment part according to claim 1, wherein the thickness of the colored layer is 0.5 μm to 4 μm, both inclusive.

17. The sanitary equipment part according to claim 1, wherein the part is used as one selected from the group consisting of a faucet, a part constituting a toilet, and a part constituting a bathroom.

* * * * *